(12) United States Patent
Wang et al.

(10) Patent No.: US 11,914,253 B2
(45) Date of Patent: *Feb. 27, 2024

(54) ARRAY SUBSTRATE AND MANUFACTURING METHOD THEREOF, DISPLAY PANEL

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Xiaoyuan Wang, Beijing (CN); Wu Wang, Beijing (CN); Yan Fang, Beijing (CN); Shengxue Wu, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/092,581

(22) Filed: Jan. 3, 2023

(65) Prior Publication Data

US 2023/0185140 A1 Jun. 15, 2023

Related U.S. Application Data

(63) Continuation of application No. 16/767,237, filed as application No. PCT/CN2019/126280 on Dec. 18, 2019, now Pat. No. 11,573,467.

(30) Foreign Application Priority Data

Jan. 14, 2019 (CN) .......................... 201910030803.4

(51) Int. Cl.
G02F 1/1362 (2006.01)
G02F 1/1343 (2006.01)
(Continued)

(52) U.S. Cl.
CPC .... *G02F 1/136227* (2013.01); *G02F 1/13439* (2013.01); *H01L 27/124* (2013.01);
(Continued)

(58) Field of Classification Search
CPC .......... G02F 1/136227; G02F 1/13439; H01L 27/124
See application file for complete search history.

(56) References Cited

U.S. PATENT DOCUMENTS 8,339,553 B2  12/2012  Huang et al.
9,761,617 B2  9/2017   Liu et al.
(Continued)

FOREIGN PATENT DOCUMENTS

CN  102074505 A  5/2011
CN  203085536 U  7/2013
(Continued)

OTHER PUBLICATIONS

International Search Report from International Application No. PCT/CN2019/126280 dated Mar. 19, 2020.
(Continued)

*Primary Examiner* — Lucy P Chien
(74) *Attorney, Agent, or Firm* — Dilworth & Barrese, LLP.; Michael J. Musella, Esq.

(57) ABSTRACT

Embodiments of the present disclosure provides an array substrate and a manufacturing method thereof, a display panel. The array substrate includes: a base (10); a pixel electrode (50) and a thin film transistor disposed on the base (10); a passivation layer (16) covering the thin film transistor and the pixel electrode (50), the passivation layer (16) being
(Continued)

provided with a transferring through hole (K1, K2) that simultaneously exposes the pixel electrode (50) and a drain electrode (15) or a source electrode (14) of the thin film transistor; a connection electrode (60) disposed on the passivation layer (16) and at the transferring through hole (K1, K2), the connection electrode (60) connected with the pixel electrode (50), and the drain electrode (15) or the source electrode (14) through the transferring through hole (K1, K2). The present disclosure realizes a connection between the drain electrode (15) or the source electrode (14) and the pixel electrode (50) by using one transferring through hole (K1, K2), which effectively reduces the number of through holes, increases an aperture ratio of the display panel, improves product quality and yield.

16 Claims, 8 Drawing Sheets

(51) Int. Cl.
    *H01L 27/12*     (2006.01)
    *G02F 1/1368*     (2006.01)

(52) U.S. Cl.
    CPC ........ *H01L 27/1259* (2013.01); *G02F 1/1368* (2013.01); *G02F 1/134363* (2013.01); *G02F 2201/40* (2013.01)

(56) References Cited

U.S. PATENT DOCUMENTS

| | | |
|---|---|---|
| 10,580,801 B2 | 3/2020 | Suzumura et al. |
| 2012/0115344 A1 | 5/2012 | Makiguchi |
| 2015/0116623 A1 | 4/2015 | Tomioka et al. |
| 2016/0048065 A1 | 2/2016 | Ono |
| 2018/0083718 A1 | 2/2018 | Cheng |

FOREIGN PATENT DOCUMENTS

| | | |
|---|---|---|
| CN | 105070684 A | 11/2015 |
| CN | 205428907 U | 8/2016 |
| CN | 105974704 A | 9/2016 |
| CN | 107065347 A | 8/2017 |
| CN | 107093584 A | 8/2017 |
| CN | 108335631 A | 7/2018 |
| CN | 109752891 A | 5/2019 |
| JP | 2018200429 A | 12/2018 |

OTHER PUBLICATIONS

U.S. Office Action from U.S. Appl. No. 16/767,237 dated May 27, 2020.
Extended European Search Report from Application No. 19910539.6 dated Jul. 18, 2022.
Office Action issued by the Indian Patent Office in the corresponding Indian application No. 202047047158; The Office Action/Search Report dated Dec. 9, 2021.
Second Chinese Office Action from Chinese Patent Application No. 20190030803.4 dated Aug. 5, 2020.

ARRAY SUBSTRATE AND MANUFACTURING METHOD THEREOF, DISPLAY PANEL

TECHNICAL FIELD

The present disclosure relates to an array substrate and a manufacturing method thereof, a display panel.

BACKGROUND

A Liquid Crystal Display (LCD) has characteristics such as small volume, low power consumption, radiationless, and etc., and has developed rapidly in recent years. A mainbody structure of the LCD includes a thin film transistor (TFT) array substrate and a color filter (CF) substrate cell-assembled with each other, liquid crystal (LC) molecules are filled between the array substrate and the color filter substrate and an electric field that drives the deflection of the liquid crystal is formed by controlling a common electrode and a pixel electrode for realizing a gray-scale display. According to the display mode, the LCD may be divided into a twisted nematic (TN) display mode, a in plane switching (IPS) display mode and an advanced super dimension switch (ADS) display mode and the like. The ADS display mode has become a relatively mature display mode, which has advantages of wide view angle, high aperture ratio, high penetration rate, high resolution, fast response speed, low power consumption, and low chromatic aberration and the like.

In recent years, on a basis of the ADS display mode, an IADS (Interchange Advanced Super Dimension Switch) display mode is proposed in the prior art. Study indicates that when a dual-gate pixel architecture is used, the IADS display mode can improve luminous efficiency, thereby improving transmittance of a pixel. The dual-gate pixel architecture can reduce the number of source driving integrated circuit ICs and reduce cost. Therefore, the IADS display mode has been increasingly widely used.

SUMMARY

Embodiments of the present disclosure provides an array substrate and a manufacturing method thereof, a display panel, which is able to increase the aperture ratio and yield.

In an aspect, embodiments of the present disclosure provide an array substrate comprising:

a base;

a pixel electrode and a thin film transistor, disposed on the base;

a passivation layer, covering the thin film transistor and the pixel electrode, the passivation layer being provided with a transferring through hole exposing the pixel electrode and a drain electrode or a source electrode of the thin film transistor simultaneously;

a connection electrode, disposed on the passivation layer and at the transferring through hole, and the connection electrode is connected with the pixel electrode, and the drain electrode or the source electrode through the transferring through hole.

Optionally, an orthographic projection of the transferring through hole on the base overlaps with an orthographic projection of the pixel electrode on the base and an orthographic projection of the drain electrode or the source electrode on the base.

Optionally, the array substrate according to embodiments of the present disclosure further comprises a gate line and a data line, the thin film transistor comprises a gate electrode, an active layer, the source electrode and the drain electrode, the pixel electrode, the gate line and the gate electrode are disposed on the base, the pixel electrode, the gate line and the gate electrode are covered with a gate insulation layer, the active layer, the source electrode, the drain electrode and the data line are disposed on the gate insulation layer, and a conductive channel is formed between the source electrode and the drain electrode.

Optionally, a first compensation block is disposed at a side of the connection electrode close to the gate line, an orthographic projection of the first compensation block on the base includes at least a portion of an orthographic projection of an edge of the drain electrode or the source electrode at a side adjacent to the gate line on the base, and/or, an second compensation block is disposed at a side of the connection electrode away from the gate line, an orthographic projection of the second compensation block on the base includes at least a portion of an orthographic projection of an edge of the source electrode or the drain electrode at a side away from the gate line on the base.

Optionally, the first compensation block extends from a mainbody of the connection electrode towards the gate line, the second compensation block extends from the mainbody of the connection electrode to a direction away from the gate line, and sizes of the first compensation block and the second compensation block are smaller than a size of the mainbody in a direction parallel to a direction of the gate line.

Optionally, an orthographic projection of the connection electrode on the base covers an orthographic projection of an overlapped region between the drain electrode or the source electrode and the pixel electrode on the base.

Optionally, shapes of the first compensation block and/or the second compensation block comprises a rectangle, a trapezoid, a semicircle or a semi-ellipse.

Optionally, the transferring through hole comprises a first through hole portion and a second through hole portion, the first through hole portion exposes the drain electrode, the second through hole portion exposes the pixel electrode.

In another aspect, embodiments of the present disclosure also provide a display panel comprising the above-mentioned array substrate.

In yet another aspect, embodiments of the present disclosure also provide a manufacturing method of the array substrate, comprising:

forming a pixel electrode and a thin film transistor;

forming a passivation layer covering the thin film transistor, the passivation layer being provided with a transferring through hole that exposes the pixel electrode and a drain electrode or a source electrode of the thin film transistor simultaneously; and forming a connection electrode on the passivation layer and at the transferring through hole, and the connection electrode is simultaneously connected with the pixel electrode, and the drain electrode or the source electrode through the transferring through hole.

Optionally, the forming a pixel electrode and a thin film transistor on the base comprises: forming the pixel electrode, a gate line and a gate electrode by means of one patterning process; and forming a gate insulation layer, an active layer, a source electrode, a drain electrode and a data line by means of one patterning process, forming a conductive channel between the source electrode and the drain electrode.

Optionally, a first compensation block is disposed at a side of the connection electrode close to the gate line, an orthographic projection of the first compensation block on the base includes at least a portion of an orthographic projection of an edge of the drain electrode or the source electrode at a side adjacent to the gate line on the base, and/or, a second compensation block is disposed at a side of the connection electrode away from the gate line, an orthographic projection of the second compensation block on the base includes at least a portion of an orthographic projection of an edge of the drain electrode or the source electrode at a side away from the gate line on the base.

Optionally, the first compensation block extends from a mainbody of the connection electrode towards the gate line, the second compensation block extends from the mainbody of the connection electrode to a direction away from the gate line, and sizes of the first compensation block and the second compensation block are smaller than a size of the mainbody in a direction parallel to a direction of the gate line.

Optionally, the transferring through hole comprises a first through hole portion and a second through hole portion, the first through hole portion exposes the drain electrode, and the second through hole portion exposes the pixel electrode.

Optionally, the forming a pixel electrode, a gate line and a gate electrode by means of one patterning process comprises: depositing a first transparent conductive film and a first metal film on the base sequentially; coating a layer of photoresist on the first metal film, gradient exposing and developing the photoresist using a halftone mask or a gray tone mask, forming an unexposed region at a location where the gate line and the gate electrode to be formed are located, the unexposed region being with a photoresist having a first thickness, forming a partially exposed region at a location where the pixel electrode to be formed is located, the partially exposed region being with a photoresist having a second thickness, forming a fully exposed region at other locations without a photoresist, and the first thickness is greater than the second thickness; etching away the first metal film and the first transparent conductive film in the fully exposed region by means of a first etching process; removing the photoresist in the partially exposed region by means of an ashing process, exposing the first metal film; and etching away the first metal film in the partially exposed region by means of a second etching process, removing a remaining portion of the photoresist and forming the pixel electrode, the gate line and the gate electrode on the base.

Optionally, the forming a gate insulation layer, an active layer, a source electrode, a drain electrode and a data line, forming a conductive channel between the source electrode and the drain electrode by means of one patterning process comprises: depositing a gate insulation film, a semiconductor film and a second metal film on the base on which the pixel electrode, the gate line and the gate electrode are formed; coating a layer of photoresist on the second metal film, gradient exposing and developing the photoresist using a halftone mask or a gray tone mask, forming an unexposed region at a location where the source electrode, the drain electrode and the data line to be formed are located, the unexposed region being with a photoresist having a first thickness, forming a partially exposed region at a location where the conductive channel to be formed is located, the partially exposed region being with a photoresist having a second thickness, forming a fully exposed region at other locations without a photoresist, and the first thickness is greater than the second thickness; etching away the second metal film and the semiconductor film in the fully exposed region by means of a first etching process; removing the photoresist in the partially exposed region by means of an ashing process, exposing the second metal film; and etching away the second metal film in the partially exposed region by means of a second etching process, removing a remaining portion of the photoresist, forming the gate insulation layer, the active layer, the source electrode, the drain electrode and the data line, forming a conductive channel between the source electrode and the drain electrode.

Optionally, the forming the passivation layer covering the thin film transistor, and the passivation layer being provided with a transferring through hole that exposes the pixel electrode and a drain electrode or a source electrode of the thin film transistor simultaneously comprises: depositing a passivation film on a base on which the thin film transistor and the pixel electrode are formed; coating a layer of photoresist on the passivation film, exposing and developing the photoresist using a monotone mask, forming an exposed region at a location of the transferring through hole without the photoresist, forming an unexposed region at other locations in which the photoresist is remained; etching away the passivation film and the gate insulation layer in the fully exposed region by means of an etching process, forming the passivation layer in which the transferring through hole is formed and the transferring through hole exposing a drain electrode and a pixel electrode simultaneously, and the transferring through hole comprises a first through hole portion and a second through hole portion, the passivation film in the first through hole portion is etched away and the drain electrode is exposed, and the passivation film and the gate insulation layer in the second through hole portion are etched away and the pixel electrode is exposed.

BRIEF DESCRIPTION OF THE DRAWINGS

The above and/or additional aspects and advantages of the present invention will become apparent and readily understood comprehended, in which.

ILLUSTRATION OF REFERENCE SIGNS

10—base; 20—common electrode; 30—gate line; 40—data line; 50—pixel electrode; 60—connection electrode;
60A—first compensation block; 60B—second compensation block;
11—gate electrode;
12—gate insulation layer; 13—active layer; 14—source electrode;
15—drain electrode; 16—passivation layer; 121—recessed end surface;
131—active layer protrusion; K1—first through hole portion; K2—second through hole portion.

DETAILED DESCRIPTION

In order to make the object, technical solutions and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, the technical or scientific terms used herein shall have ordinary meaning understood by one of ordinary skill in the art to which the invention belongs. The terms "first", "second," and the like used in the present disclosure are not intended to indicate any order, amount, or importance, but distinguish different constituent parts. The terms "comprise," "comprising," "include," "including," etc., means that an element or object preceding the word encompasses element(s) or object(s) listed after this word and equivalents thereof, without excluding other elements or objects. The terms "connected" or "connecting" and the like are not limited to physical or mechanical connections, but may include electrical connections, whether direct or indirect. "On", "under", "left", "right" and the like are only used to indicate relative positional relationships, and when an absolute position of an object described is changed, its relative positional relationship may also be changed accordingly.

Inventors of the present application have found that a display panel of an IADS display mode has defects of small aperture ratio and low yield.

The specific implementations of the present disclosure will be further described in detail below in combination with drawings and embodiments. The following embodiments are used to illustrate the present disclosure, but not limit the scope of the present disclosure. It is noted that the features in the same embodiment and different embodiments of the present application may be combined with each other without confliction.

Figure 1:
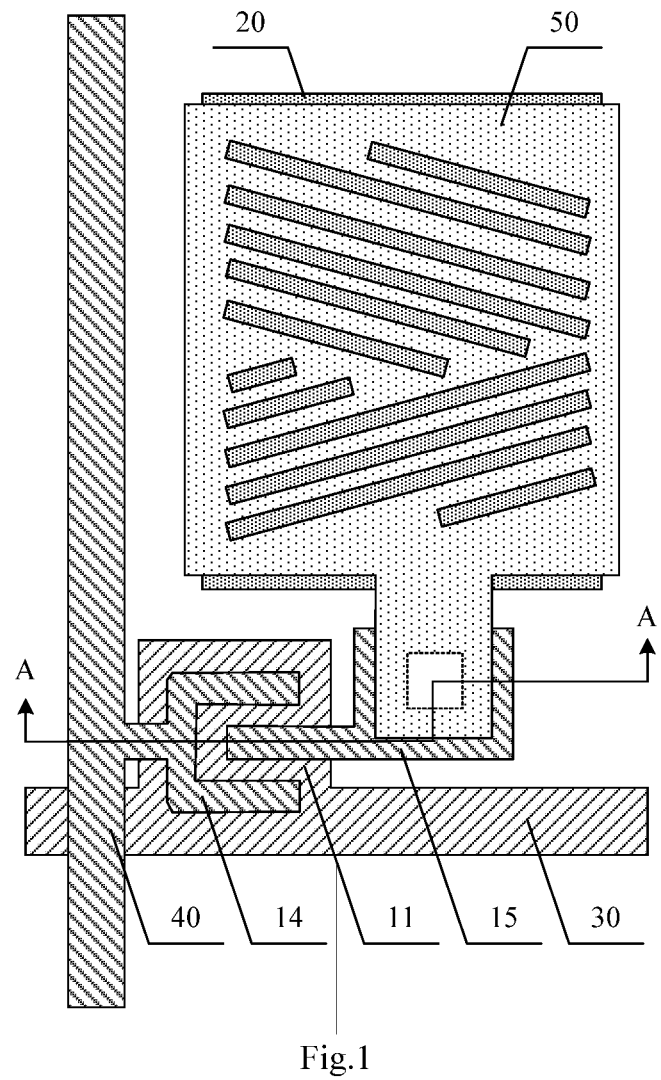
FIG. 1 is a schematic illustration of a structure of an ADS display mode array substrate.
Figure 2:
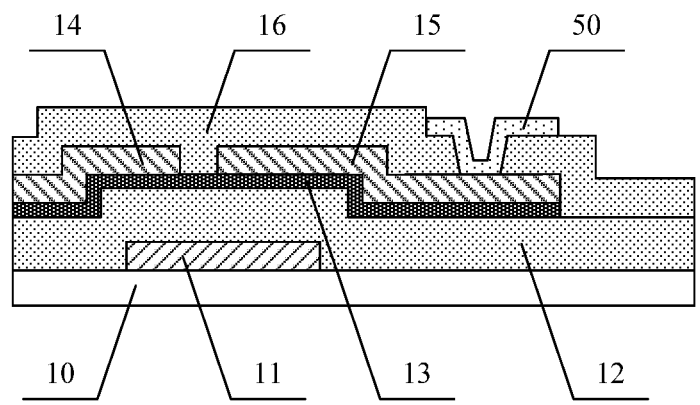
FIG. 2 is a cross-sectional view along line A-A in FIG. 1.

FIG. 1 is a schematic illustration of a structure of an ADS display mode array substrate, and FIG. 2 is a cross-sectional view along line A-A in FIG. 1. A structure of the array substrate of the shown ADS display mode is characterized in that a common electrode is disposed on a base as a plate electrode, a pixel electrode is disposed on a passivation layer as a slit electrode, and a film layer structure of the array substrate includes a base, the common electrode, a gate line, a gate electrode and a common electrode wire, a gate insulation layer (GI), an active layer, a source electrode, a drain electrode and a data line, the passivation layer (PVX), the pixel electrode. When switch-on voltage is applied to the gate line, data signal of the data line is written into the drain electrode by the thin film transistor and transferred to the pixel electrode through a single hole to complete signal writing. As shown in FIG. 1 and FIG. 2, the array substrate includes: a base 10; a common electrode 20, a gate line 30 and a gate electrode 11 that are disposed on the base; a gate insulation layer 12 covering the common electrode 20, the gate line 30 and the gate electrode 11; an active layer 13, a source electrode 14, a drain electrode 15 and a data line 40 that are disposed on the gate insulation layer 12; a conductive channel formed between the source electrode 14 and the drain electrode 15; a passivation layer 16 covering the source electrode 14, the drain electrode 15, the data line 40 and the conductive channel, and the passivation layer 16 being provided with a through hole exposing a drain electrode 15; and a pixel electrode 50 disposed on the passivation layer 16 and connected with the drain electrode 15 through the through hole in the passivation layer 16. Herein, the common electrode 20 is used to provide a common voltage, the pixel electrode 50 is used to provide a pixel voltage for displaying, and deflection of liquid crystal is driven by a multi-dimensional electric field produced between the slit electrode and the plate electrode.

Figure 3:
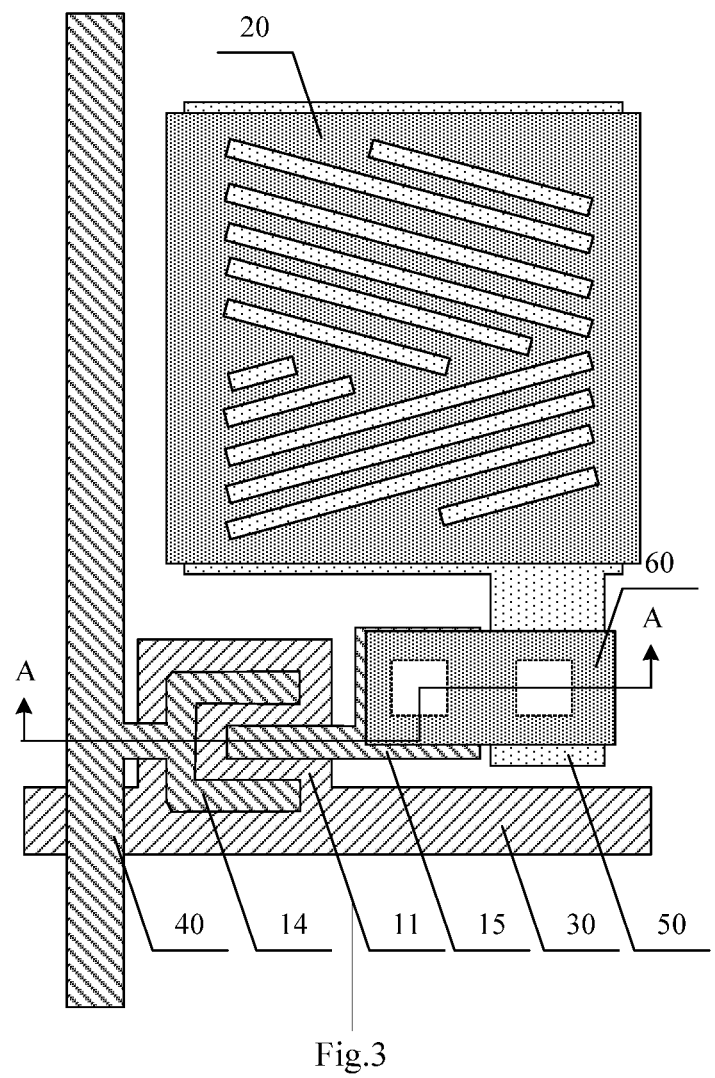
FIG. 3 is a schematic illustration of a structure of an LADS display mode array substrate.
Figure 4:
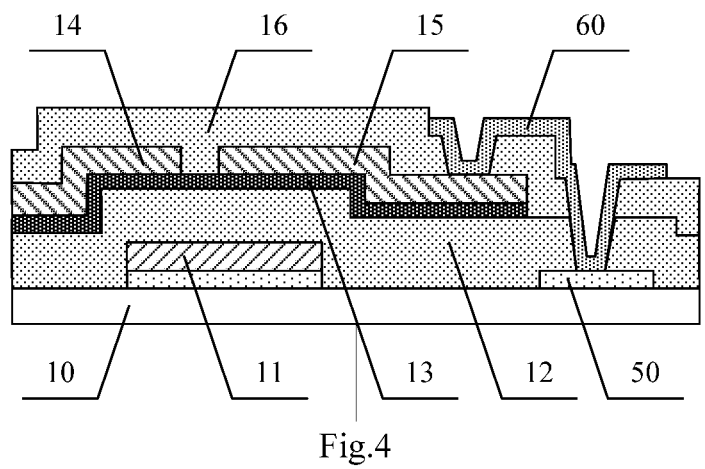
FIG. 4 is a cross-sectional view along line A-A in FIG. 3.

FIG. 3 is a schematic illustration of a structure of an LADS display mode array substrate, and FIG. 4 is a cross-sectional view along line A-A in FIG. 3. Such LADS display mode exchanges locations of the common electrode and of the pixel electrode on the basis of the ADS display mode, a structure of the array substrate is characterized in that a pixel electrode is disposed on a base as a plate electrode, a common electrode is disposed on a passivation layer as a slit electrode, and a film layer structure of the array substrate includes a base, the pixel electrode, a gate line and a gate electrode, a gate insulation layer, an active layer, a source electrode, a drain electrode, a data line and a common electrode wire, the passivation layer, the common electrode and a connection electrode. When switch-on voltage is applied to the gate line, data signal of the data line is written into the drain electrode by a thin film transistor and transferred to the pixel electrode through a dual-hole to complete signal writing. As shown in FIG. 3 and FIG. 4, the array substrate includes: a base 10; a pixel electrode 50, a gate line 30 and a gate electrode 11 that are disposed on the base; a gate insulation layer 12 covering the pixel electrode 50, the gate line 30 and the gate electrode 11; an active layer 13, a source electrode 14, a drain electrode 15 and a data line 40 that are disposed on the gate insulation layer 12; a conductive channel formed between the source electrode 14 and the drain electrode 15; a passivation layer 16 covering the source electrode 14, the drain electrode 15, the data line 40 and the conductive channel, the passivation layer 16 being provided with a first through hole exposing the drain electrode 15 and a second through hole exposing the pixel electrode 50; and a common electrode 20 and a connection electrode 60 that are disposed on the passivation layer 16, the connection electrode 60 being connected with the drain electrode 15 through the first through hole in one hand and connected with the pixel electrode 50 through the second through hole in the other hand, i.e., connection between the pixel electrode 50 and the drain electrode 15 is implemented by a dual-hole structure.

Inventors of the present application have found that the reason why the above display panel of the IADS display mode has defects of small aperture ratio and low yield is significantly caused by the dual-hole structure. Specifically, a size, a shape and the number of the through hole have big influence on an aperture ratio and a yield, and the influence is more important for high resolution products, and compared with a single hole structure of the ADS display mode, relatively large structure space is required by the dual-hole structure of the IADS display mode, which accordingly reduces an area of the pixel electrode, and therefore the display panel of the IADS display mode has a relatively small aperture ratio. Although the area of the pixel electrode can be increased as much as possible by adjusting a width of the signal line, such method severely influences a charge rate of the pixel electrode. Meanwhile, since the number of the pixel electrodes in the display region is up to tens of millions, the large-screen products even have hundreds of millions of the pixel electrodes, and compared with the single hole structure of the ADS display mode, the IADS display mode has a double amount of through holes, which affects the diffusion uniformity of an orientation film (PI), and the display panel macroscopically shows mura similar to a stain, which is called as a panel stain or a panel spot, at a non-uniform location of the orientation film, affecting the product quality and reducing the yield.

For this purpose, embodiments of the present disclosure provide an array substrate capable of increasing aperture ratio and yield. The array substrate of embodiments of the present disclosure includes: a base; a pixel electrode and a thin film transistor disposed on the base; a passivation layer covering the thin film transistor and the pixel electrode and provided with a transferring through hole that exposes the pixel electrode and a drain electrode or a source electrode of the thin film transistor at the same time; a connection electrode disposed on the passivation layer and at the transferring through hole, and the connection electrode is connected with the pixel electrode, and the drain electrode or the source electrode through the transferring through hole.

The technical solutions of embodiments of the present disclosure is illustrated in detail below by specific embodiments.

A First Embodiment

Figure 5:
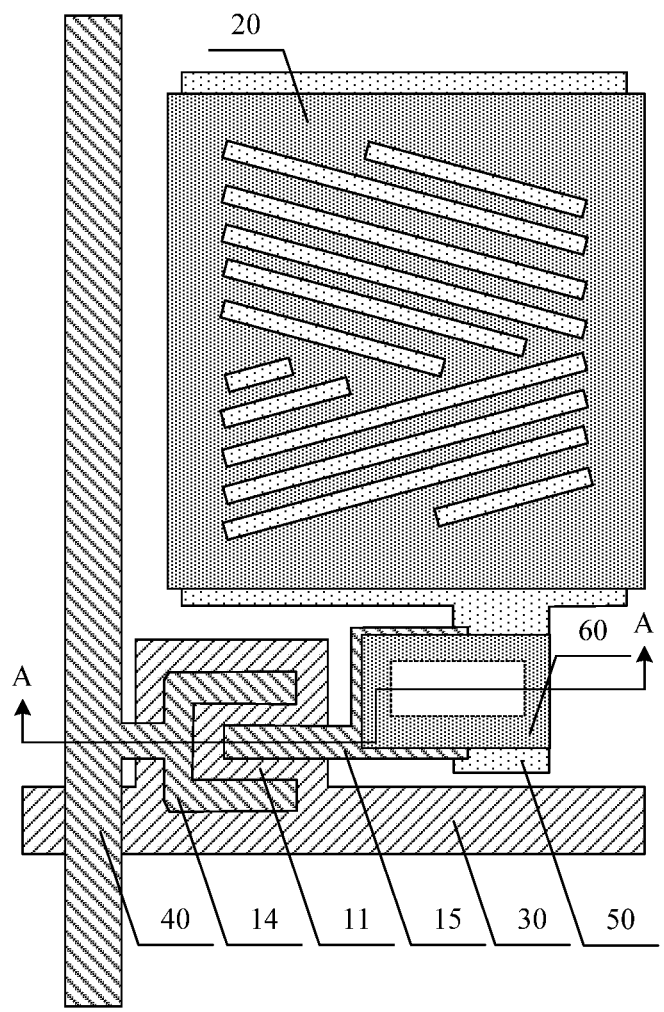
FIG. 5 is a schematic illustration of a structure of a first embodiment of an array substrate of the present disclosure.
Figure 6:
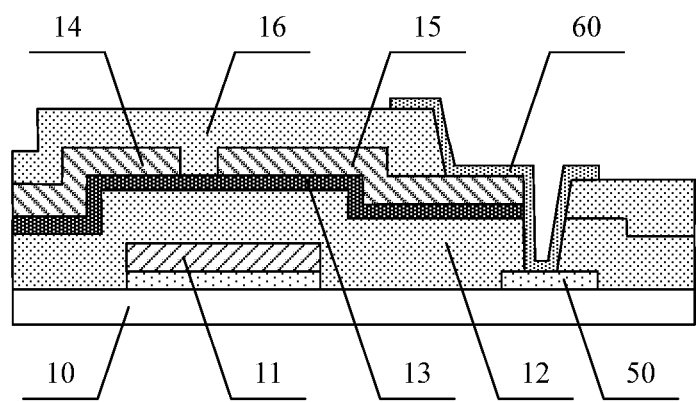
FIG. 6 is a cross-sectional view along line A-A in FIG. 5.

FIG. 5 is a schematic illustration of a structure of a first embodiment of an array substrate of the present disclosure, FIG. 6 is a cross-sectional view along A-A line in FIG. 5. As shown in FIG. 5 and FIG. 6, the array substrate provided by this embodiment includes:

a base 10;

a pixel electrode 50, a gate line 30 and a gate electrode 11 disposed on the base 10;

a gate insulation layer 12 covering the pixel electrode 50, the gate line 30 and the gate electrode 11;

an active layer 13, a source electrode 14, a drain electrode 15 and a data line 40 that are disposed on the gate insulation layer 12, a conductive channel formed between the source electrode 14 and the drain electrode 15;

a passivation layer 16 covering the active layer 13, the source electrode 14, the drain electrode 15 and the data line 40, the passivation layer 16 being provided with one transferring through hole simultaneously exposing both the drain electrode 14 and the pixel electrode 50; and a common electrode 20 and a connection electrode 60 that are disposed on the passivation layer 16, the connection electrode 60 connected with both the drain electrode 15 and the pixel electrode 50 at the same time through the one transferring through hole.

In the embodiment, the gate electrode 11, the active layer 13, the source electrode 14 and the drain electrode 15 constitute a thin film transistor disposed within a pixel region defined by the gate line 30 and the data line 40 vertically intersected with each other, and the lower pixel electrode 50 is a plate electrode, the upper common electrode 20 is a slit electrode, the common electrode 20 together with the pixel electrode 50 form a multi-dimensional electric field so as to constitute the array substrate of the IADS mode.

The technical solutions of this embodiment are further illustrated below by a manufacturing process of the array substrate of this embodiment. The "patterning process" mentioned in the embodiment includes depositing a film layer, coating a photoresist, exposing by using a mask, developing, etching, removing the photoresist and other processing, which is a mature manufacturing processes in the related art. The depositing may employ a known process such as sputtering, evaporation, chemical vapor deposition and the like, the coating may employ a known coating process, and the etching may employ the known method, which are not defined specifically herein. In description of this embodiment, it should be understood that "film" refers to a layer of film produced by depositing or other processes using a certain material on the base. If the "film" does not require a patterning process in a process of the entire manufacturing, then the "film" may also be called a "layer". If the "film" requires the patterning process in the process of the entire manufacturing, then it is called a "film" before the patterning process and a "layer" after the patterning process. The "layer" after the patterning process includes at least one "pattern".

Figure 7:
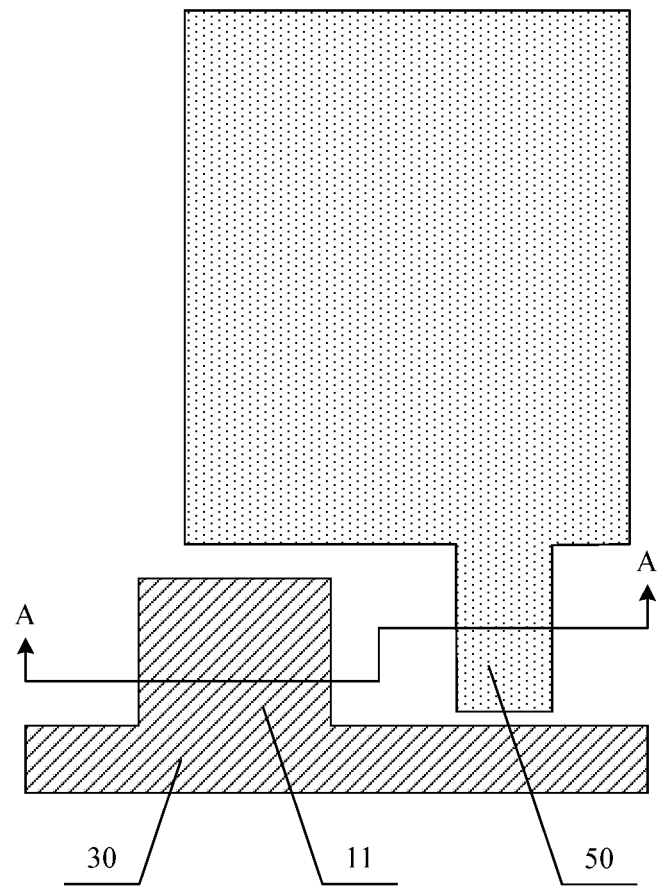
FIG. 7 is a schematic illustration after forming patterns of a pixel electrode, a gate line and a gate electrode in the first embodiment of the present disclosure.
Figure 8:
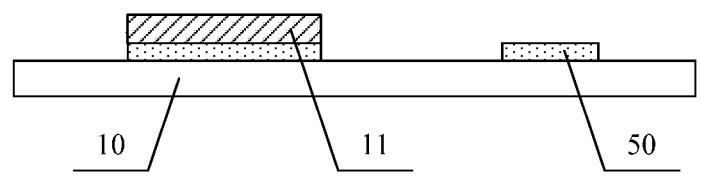
FIG. 8 is a cross-sectional view along line A-A in FIG. 7.

In a first patterning process, patterns of a pixel electrode, a gate line and a gate electrode are formed on the base. Forming patterns of the pixel electrode, the gate line and the gate electrode on the base includes: sequentially depositing a first transparent conductive film and a first metal film on the base; coating a layer of photoresist on the first metal film; gradient exposing and developing the photoresist using a halftone mask or a gray tone mask; forming an unexposed region at a location where the gate line and the gate electrode are located with a photoresist having a first thickness, forming a partially exposed region at a location where the pixel electrode is located with a photoresist having a second thickness, forming a fully exposed region at other locations without a photoresist. Herein, the first thickness is greater than the second thickness. A fully exposed region is etched and the first metal film and the first transparent conductive film in the region are etched away by means of a first etching process. The photoresist in the partially exposed region is removed by means of an ashing process, so as to expose the first metal film. The first metal film in the partially exposed region is etched by means of a second etching process, the first metal film in the region is etched away and the first transparent conductive film remains, and the remaining photoresist is removed, the patterns of the pixel electrode 50, the gate line 30 and the gate electrode 11 are formed on the base 10, in which the pixel electrode 50 is a plate electrode, and there is the first transparent conductive film maintained below the gate line 30 and the gate electrode 11, as shown in FIG. 7 and FIG. 8, which FIG. 8 is a cross-sectional view along line A-A in FIG. 7. The base may employ glass, plastic or flexible transparent plate, the first metal film employs a metal material, such as aluminum, copper, molybdenum, titanium, niobium, silver, gold, tantalum, tungsten, chromium and other materials, and may be a single-layer structure, and also be a multi-layer composite structure, and the first transparent conductive film may employ indium tin oxide ITO or indium zinc oxide IZO, and may be deposited by using a radio frequency magnetron sputtering method.

Figure 9:
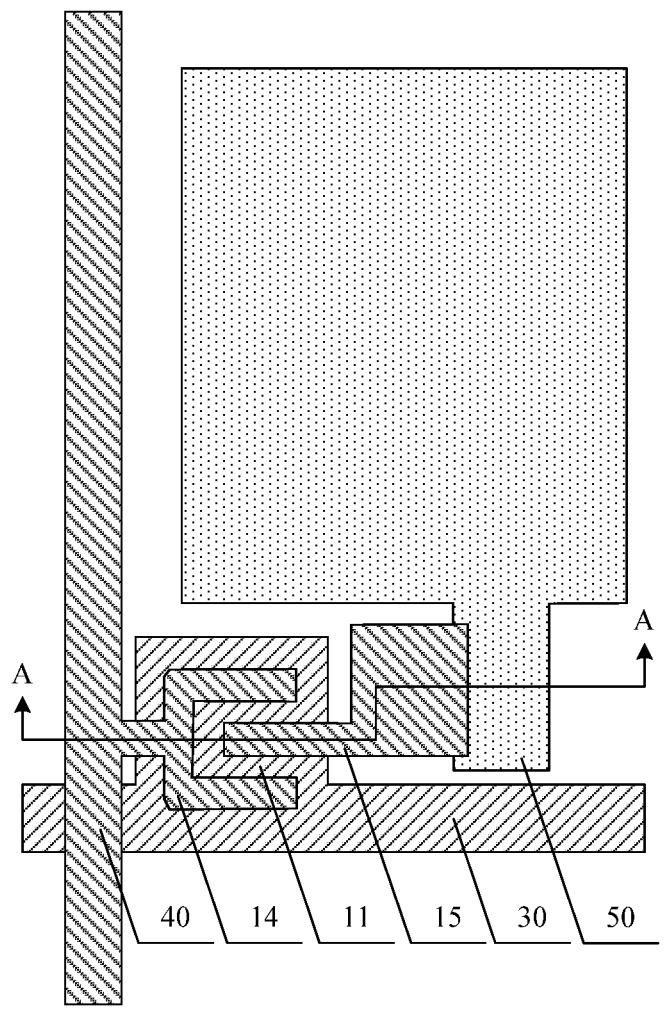
FIG. 9 is a schematic illustration after forming patterns of an active layer, a source electrode, a drain electrode and a data line in the first embodiment of the present disclosure.
Figure 10:
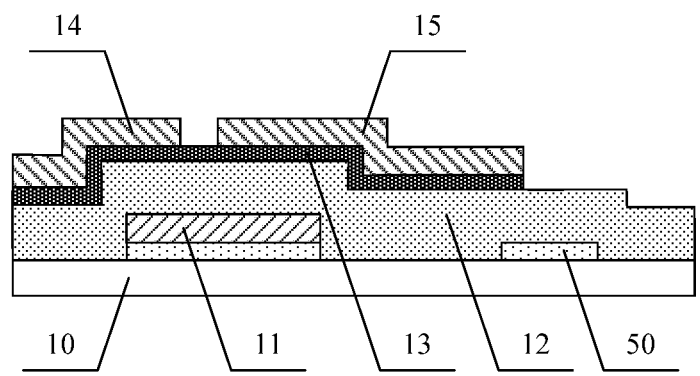
FIG. 10 is a cross-sectional view along line A-A in FIG. 9.

In the second patterning process, patterns of an active layer, a source electrode, a drain electrode and a data line are formed. Forming the patterns of the active layer, the source electrode, the drain electrode and the data line includes: sequentially depositing an gate insulation film, a semiconductor film and a second metal film on the base on which the above mentioned patterns are formed, coating a layer of photoresist on the second metal film, gradient exposing and developing the photoresist using a halftone mask or a gray tone mask, forming an unexposed region at a location where the source electrode, the drain electrode and the data line are located with a photoresist having a first thickness, forming a partially exposed region at a location where a conductive channel is formed with a photoresist having a second thickness, forming a fully exposed region at other locations without a photoresist. The first thickness is greater than the second thickness. A fully exposed region is etched and the second metal film and the semiconductor film in the region are etched away by means of the first etching process. The photoresist in the partially exposed region is removed by means of an ashing process to expose the second metal film. The second metal film in the partially exposed region is etched by means of a second etching process, the second metal film in the region is etched away, and the remaining photoresist is removed, to form patterns of the gate insulation layer 12, the active layer 13, the source electrode 14, the drain electrode 15 and the data line 40 on the base 10 and form a conductive channel between the source electrode 14 and the drain electrode 15, wherein an end of the source electrode 14 away from the conductive channel is connected with the data line 40, and there is a semiconductor film maintained below the source electrode 14, the drain electrode 15 and the data line 40, as shown in FIG. 9 and FIG. 10, and FIG. 10 is a cross-sectional view along line A-A in FIG. 9. A gate insulation film may employ silicon nitride (SiNx), silicon oxide (SiOx) or silicon oxynitride (Si(ON)x), may be a single-layer, double-layer or multi-layer structure, and is deposited using a chemical vapor deposition (CVD) method or a plasma enhanced chemical vapor deposition (PECVD); the second metal film 50 may employ a metal material, such as aluminum, copper, molybdenum, niobium, titanium, silver, gold, tantalum, tungsten, chromium, and other materials, and may be a single-layer structure and also a multi-layer composite structure, and is deposited by a radio frequency magnetron sputtering method.

Figure 11:
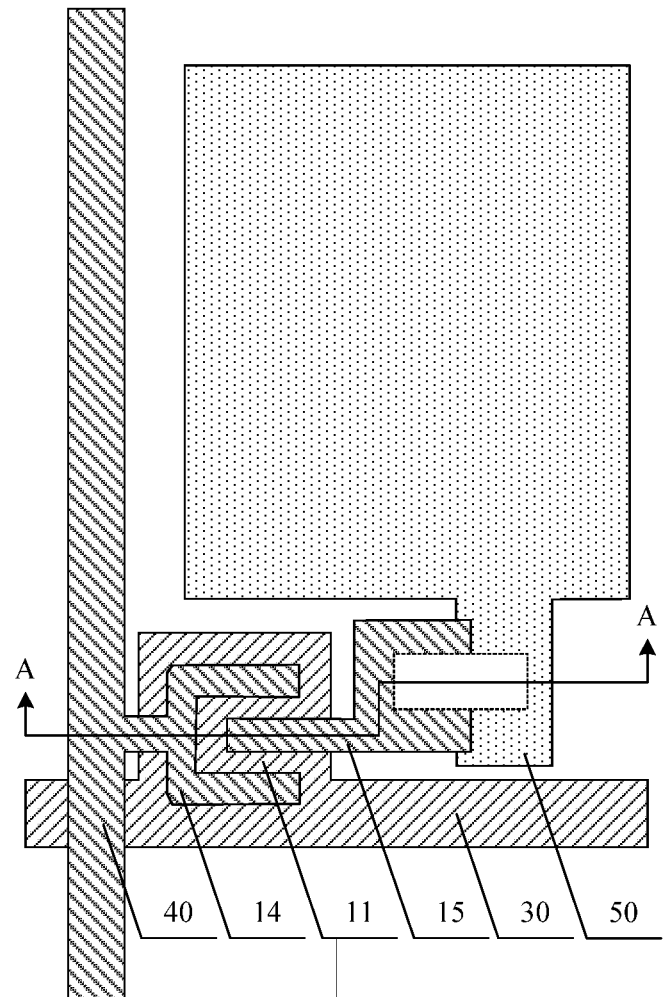
FIG. 11 is a schematic illustration after forming a pattern of a transferring through hole in the first embodiment of the present disclosure.
Figure 12:
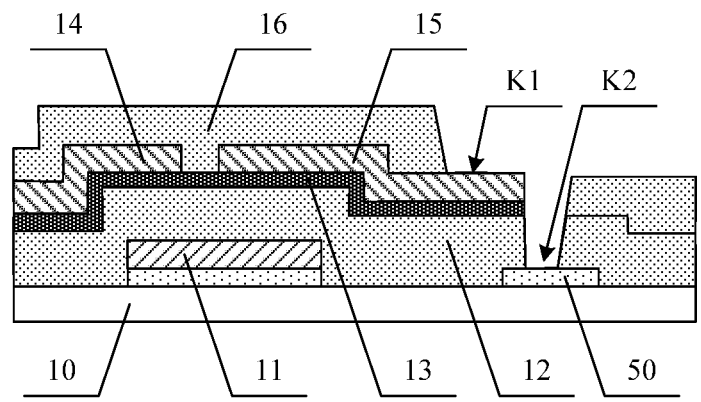
FIG. 12 is a cross-sectional view along line A-A in FIG. 11.

In the third patterning process, a pattern of a transferring through hole is formed. Forming the pattern of the transferring through hole includes: depositing a passivation film on the base formed with the above mentioned patterns, coating a layer of photoresist on the passivation film, exposing and developing the photoresist by using a monotone mask, forming an exposed region at a location where the transferring through hole is located without the photoresist, forming an unexposed region at other locations with retained photoresist. The fully exposed region is etched and the passivation film and the gate insulation layer in the region are etched away by means of an etching process, the pattern of the passivation layer 16 in which one transferring through hole is formed is formed and the transferring through hole simultaneously the drain electrode 15 and the pixel electrode 50, as shown in FIG. 11 and FIG. 12, and FIG. 12 is a cross-sectional view along line A-A in FIG. 11. In this embodiment, the transferring through hole includes two half holes, the passivation film within in a first through hole portion K1 is etched away to expose the drain electrode 15, and the passivation film and the gate insulation layer in a second through hole portion K2 are etched away to expose the pixel electrode 50, so that the transferring through hole including the two half holes exposes the drain electrode 15 and the pixel electrode 50 simultaneously. The passivation film may employ silicon nitride(SiNx), silicon oxide (SiOx) or silicon oxynitride (Si(ON)x), may be a single-layer, double-layer or multi-layer structure, and is deposited using a chemical vapor deposition (CVD) method or a plasma enhanced chemical vapor deposition (PECVD).

In a fourth patterning process, patterns of a common electrode and a connection electrode are formed. Forming the patterns of the common electrode and the connection electrode includes: depositing a second transparent conductive film on the base formed with the preceding patterns, coating a layer of photoresist on the second transparent conductive film, and exposing and developing the photoresist using a monotone mask, forming an unexposed region at a location where the common electrode and the connection electrode are located with retained photoresist, and forming an exposed region at other locations without the photoresist. The fully exposed region is etched by means of the etching process, and the second transparent conductive film in the region is etched away to form the patterns of the common electrode 20 and the connection electrode 60, the common electrode 20 is a slit electrode and the connection electrode 60 is disposed at a location where the transferring through hole is located and is connected with the drain electrode 15 exposed in the first through hole portion K1 on the one hand and with the pixel electrode 50 exposed in the second through hole portion K2 on the other hand, that is, the connection electrode 60 is connected with the drain electrode 15 and the pixel electrode 50 by the transferring through hole simultaneously, as shown in FIG. 5 and FIG. 6. The second transparent conductive film may employ indium tin oxide (ITO) or indium zinc oxide (IZO), and may be deposited by the radio frequency magnetron sputtering method. When implementing in practice, a shape of the connection electrode 60 may be a regular shape such as a rectangle, a circle, or an ellipse in a plane parallel to the base.

Although the preceding four patterning processes are taken as an example to describe the manufacturing process of the array substrate of the embodiment, when implementing in practice, the array substrate of the embodiment may also be prepared by other methods. For example, patterns of the pixel electrode, the gate line, and the gate electrode may be completed using two patterning processes. The pixel electrode pattern is formed by means of one patterning process, and then the patterns of the gate line and the gate electrode are formed by another patterning process. For another example, the patterns of the active layer, the source electrode, the drain electrode, and the data line may also be completed by using two patterning processes. Patterns of the gate insulation layer and the active layer are formed by one patterning process, and then patterns of the source electrode, the drain electrode and the data line are formed by using another patterning process. In addition, in the preceding first and second patterning processes, gradient exposing, two etchings, and ashing process are conducted by using a halftone mask or a gray tone mask, which are commonly used treatment processes in the prior art, which will not be repeated here. The array substrate may also include other film layers, such as a common electrode lead or a planarization layer, etc., and those skilled in the art can learn based on common knowledge and the prior art, which is not specifically limited herein.

It can be seen from the manufacturing process of the array substrate of the embodiment that the array substrate of the embodiment is a single hole structure, and the connection between the drain electrode and the pixel electrode is implemented by using one transferring through hole. Compared with the double-hole design in the existing structure, the embodiment effectively reduces the number of through holes, since the single hole structure occupies only a relatively small structure space, correspondingly increases an area of the pixel electrode, and increases the aperture ratio of the display panel. Simultaneously, the single hole structure of the embodiment ensures the diffusion uniformity of the orientation film, the panel stain is not easily produced, a factors that cause display defects can be eliminated, the product quality can be improved and the yield is improved. Further, the number of patterning processes for preparing the array substrate in the embodiment is the same as the number of patterning processes in the existing manufacturing method, and the process flow is the same as the existing manufacturing process flow, so the implementation of this embodiment does not need to change the existing process flow and the existing process apparatuses and has good process compatibility, strong practicability, and good application prospects.

A Second Embodiment

Figure 13:
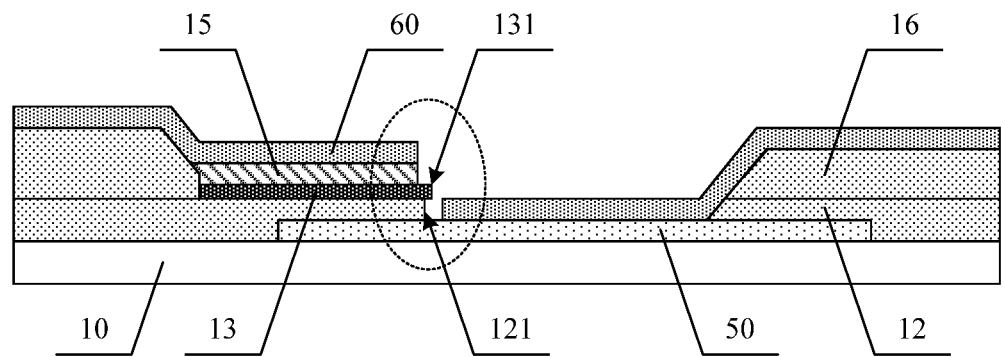
FIG. 13 is a schematic illustration of a structure of a transferring through hole of an embodiment of the present disclosure.

FIG. 13 is a schematic illustration of a structure of a transferring through hole of an embodiment of the present disclosure. As shown in FIG. 13, a half of the transferring through hole actually includes a first through hole portion (overlapped with the drain electrode 15) and a half of the transferring through hole includes a second through hole portion (overlapped with the pixel electrode 50), also called as a half hole (half via) design. Since the active layer and the source electrode/drain electrode are formed by means of one patterning process using one halftone mask or one gray tone mask, the semiconductor film exists below the drain electrode 15, and a line width CD of the semiconductor film is larger than a line width CD of the drain electrode 15, that is, there is the active layer protrusion 131. The active layer protrusion 131 appears due to a wet etching manner for the metal film and a dry etching manner for the semiconductor film, so their end portions cannot be ensured to be aligned with each other, resulting in the active layer protrusion 131 which is protruded. Simultaneously, when etching the second through hole portion (a deep hole with deeper depth) being a half of the transferring through hole, the gate insulation layer 12 located below an edge of the cross-connection of the first through hole portion being the other half of the transferring through hole (a shallow hole with shallower depth) will also be damaged and retracted to form a recessed end surface 121 of the gate insulation layer, and therefore a section will be formed at a transition of the second through hole portion and the first through hole portion (a region where the elliptical dotted line frame is located). Considering factors such as uneven interface and a stress effect, for example, a large gap is located at the section, after the connection electrode 60 is formed, the section formed at the transition of the second through hole portion and the first through hole portion will cause the connection electrode 60 to crack at the transition or increase resistance. Once the connection fails or the resistance increases, it will result in abnormal signal writing, pixel bright and dark spots, and affecting product yield and product quality.

Figure 14:
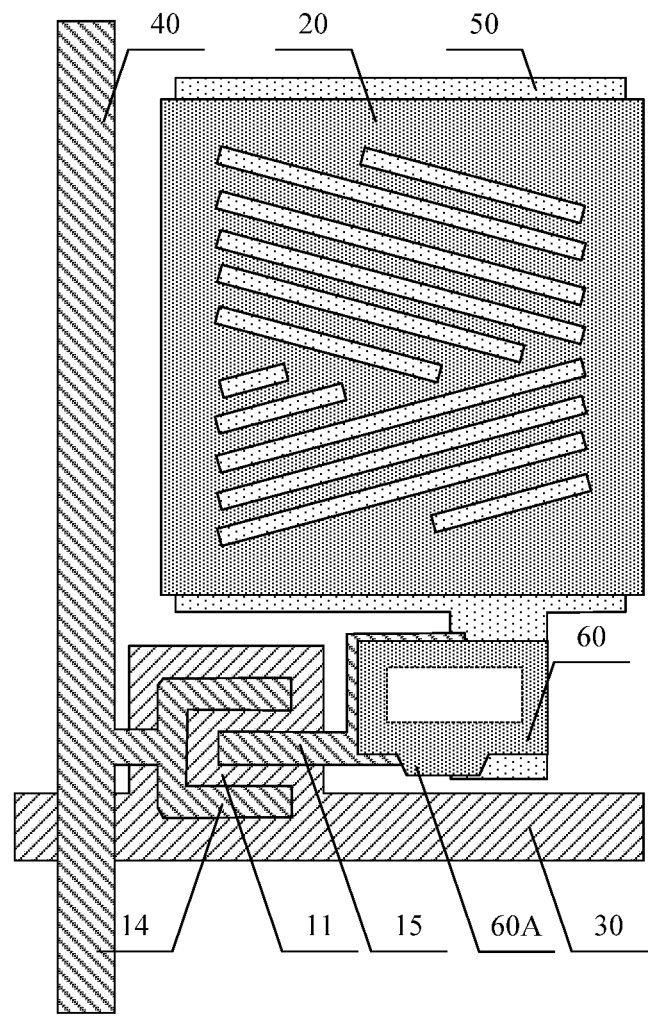
FIG. 14 is a schematic illustration of a structure of a second embodiment of an array substrate of the present disclosure.

For this reason, the embodiment provides a connection electrode with a compensation block. FIG. 14 is a schematic structural diagram of a second embodiment of an array substrate of the present disclosure. The embodiment is an extension of the preceding first embodiment, a main structure of the array substrate of the embodiment is the same with that of the preceding first embodiment, and differs from that of the preceding first embodiment in that the connection electrode of the embodiment is also provided with a first compensation block and the compensation block is used to improve the connection reliability of the connection electrode. As shown in FIG. 14, the first compensation block 60A of the embodiment is disposed on a side of the connection electrode 60 adjacent to the gate line 30, an orthographic projection of the first compensation block 60A on the base 10 includes at least a portion of an orthographic projection of an edge of the drain electrode 15 at a side adjacent to the gate line 30 on the base 10, on a direction parallel with the gate line 30 (perpendicular to the data line 40), the orthographic projection of the first compensation block 60A on the base 10 covers an orthographic projection of a boundary of an overlapped region between the drain electrode 15 and the pixel electrode 50 at a side close to the gate line 30 on the base 10, thus an orthographic projection of the connection electrode including the first compensation block 60A on the base 10 covers the orthographic projection of a boundary of a side of the overlapped region between the drain electrode 15 and the pixel electrode 50 close to the gate line 30 on the base 10. In this way, the connection electrode 60 including the first compensation block 60A not only covers the section of the transition region of the second through hole portion (a deep hole with deeper depth) and the first through hole portion (a shallow hole with shallower depth), and also covers a region outside the section, thus increasing a coverage width, and guaranteeing the process margin. Even if the connection electrode 60 cracks at the cross-connection, the first compensation block 60A covering the region outside the section will not be disconnected, thus guaranteeing reliable connection of the connection electrode, which can totally avoid the dark and light point defects of the pixel.

For example, the first compensation block extends from a mainbody of the connection electrode towards the gate line, the second compensation block extends from the mainbody of the connection electrode to a direction away from the gate line, and sizes of the first compensation block and the second compensation block are smaller than a size of the mainbody in a direction parallel to a direction of the gate line, or sizes of the first compensation block and the second compensation block are equal to or larger than a size of the mainbody in a direction parallel to a direction of the gate line.

When implementing in practice, at a plane parallel with the base, a shape of the first compensation block may be a rectangle, a trapezoid, a semicircle, or a semi-ellipse, or the like.

In a plane parallel with the base, a shape of the transferring through hole may be a rectangle, a rectangle with a rounded edge, an ellipse, a circle, or the like, which is not limited to the embodiments of the present disclosure.

The embodiment not only has the technical effect of the preceding first embodiment, that is, increasing the aperture ratio and improving the yield, but also can guarantee the connection reliability of the connection electrode by means of the compensation design, which ensures the normal writing of signal, avoiding the dark and light point defects of the pixel, and guaranteeing product yield and product quality.

A Third Embodiment

Figure 15:
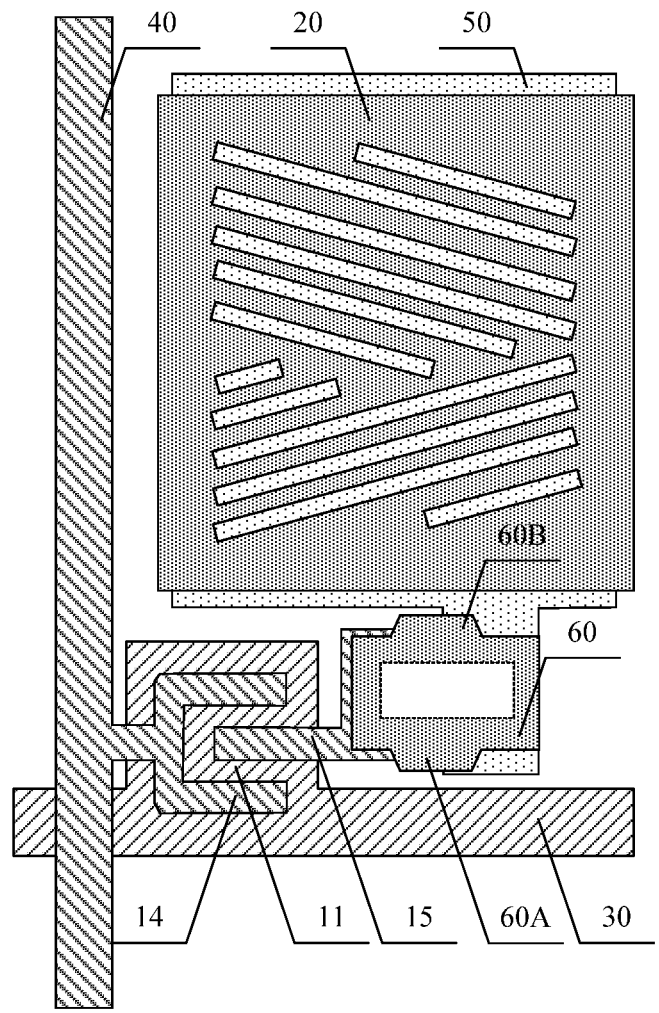
FIG. 15 is a schematic illustration of a structure of a third embodiment of an array substrate of the present disclosure.

FIG. 15 is a schematic illustration of a structure diagram of a third embodiment of an array substrate of the present disclosure. The embodiment is an extension of the preceding first embodiment, a mainbody structure of the array substrate of the embodiment is the same with that of the preceding first embodiment, and differs from the preceding first embodiment in that the connection electrode of the embodiment is also disposed with a first compensation block and a second compensation block. As shown in FIG. 15, the first compensation block 60A of the embodiment is disposed on a side of the connection electrode 60 adjacent to the gate line 30, the second compensation block 60B is disposed on a side of the connection electrode 60 away from the gate line 30, i.e., both sides of the connection electrode 60 are disposed with compensation blocks. The first compensation block 60A has the same structure with the preceding second embodiment, which will not be repeated herein. An orthographic projection of the second compensation block 60B on the base 10 includes a portion of an orthographic projection of an edge of the drain electrode 15 at a side away from the gate line 30 on the base 10, in a direction parallel with the gate line 30 (perpendicular to the data line 40), the orthographic projection of the second compensation block 60B on the base 10 covers an orthographic projection of a boundary of an overlapped region between the drain electrode 15 and the pixel electrode 50 at a side away from the gate line 30 on the base 10, thus, an orthographic projection of the connection electrode including the first compensation block 60A and the second compensation block 60B on the base 10 covers the orthographic projection of the overlapped region between the drain electrode 15 and the pixel electrode 50 on the base 10. In this way, the connection electrode 60 including the first compensation block 60A and the second compensation block 60B not only covers the section of the transition region of the second through hole portion (a deep hole with deeper depth) and the first through hole portion (a shallow hole with shallower depth), and also covers a region outside the section, thus increasing a coverage width, and guaranteeing the process margin, guaranteeing reliable connection of the connection electrode at the maximum degree, which can totally avoid the dark and light point defects of the pixel. In this embodiment, shapes of the first compensation block and the second compensation block, in a plane parallel with the base, may be a rectangle, a trapezoid, a semicircle, or a semi-ellipse, or the like. When implementing in practice, only the second compensation block may also be disposed according to a layout requirement.

For example, the first compensation block extends from the mainbody of the connection electrode toward the gate line, the second compensation block extends from the mainbody of the connection electrode to a direction away from the gate line, and sizes of the first compensation block and the second compensation block are smaller than a size of the mainbody in a direction parallel to a direction of the gate line, or sizes of the first compensation block and the second compensation block are equal to or larger than the size of the mainbody in a direction parallel to a direction of the gate line.

The embodiment not only has the technical effect of the preceding first embodiment, that is, increasing the aperture ratio and improving the yield, but also can guarantee the connection reliability of the connection electrode by means of the compensation design, which ensures the normal writing of signal, avoiding the dark and light point defects of the pixel, and guaranteeing product yield and product quality.

A Fourth Embodiment

Based on the technical concept of the preceding embodiment, the embodiment provides a manufacturing method of an array substrate, including:

S1, forming a pixel electrode and a thin film transistor;

S2, forming a passivation layer covering the thin film transistor and the pixel electrode, the passivation layer being provided with a transferring through hole that simultaneously exposes the pixel electrode and a drain electrode of the thin film transistor;

S3, forming a connection electrode on the passivation layer and at the transferring through hole, the connection electrode being simultaneously connected with the pixel electrode and the drain electrode through the transferring through hole.

And the step S1 includes:

S11, forming a pixel electrode, a gate line and a gate electrode by means of one patterning process;

S12, forming an active layer, a source electrode, a drain electrode and a data line, and forming a conductive channel between the source electrode and the drain electrode by means of one patterning process.

And the step S11 includes:

S111, sequentially depositing a first transparent conductive film and a first metal film on the base;

S112, coating a layer of photoresist on the first metal film, gradient exposing and developing the photoresist using a halftone mask or a gray tone mask, forming an unexposed region at a location where the gate line and the gate electrode are located with the photoresist having a first thickness, forming a partially exposed region at a location where the pixel electrode is located with a photoresist having a second thickness, forming a fully exposed region at other locations without a photoresist, in which the first thickness is greater than the second thickness;

S113, etching away the first metal film and the first transparent conductive film in the fully exposed region by means of a first etching process;

S114, removing the photoresist in the partially exposed region by means of an ashing process, and exposing the first metal film;

S115, etching away the first metal film in the partially exposed region by means of a second etching process, removing the remaining photoresist, and forming the pixel electrode, a gate line and a gate electrode on the base.

And the step S12 includes:

S121, sequentially depositing a gate insulation film, a semiconductor film and a second metal film;

S122, coating a layer of photoresist on the second metal film, gradient exposing and developing the photoresist using a halftone mask or a gray tone mask, forming an unexposed region at a location where a source electrode, a drain electrode and a data line are located with a photoresist having a first thickness, forming a partially exposed region at a location where the conductive channel is located with a photoresist having a second thickness, forming a fully exposed region at other locations without a photoresist, in which the first thickness is greater than the second thickness;

S123, etching away the second metal film and the semiconductor film in the fully exposed region by means of a first etching process;

S124, removing the photoresist in the partially exposed region by means of an ashing process, and exposing the second metal film;

S125, etching away the second metal film in the partially exposed region by means of a second etching process, removing the remaining photoresist, forming a gate insulation layer, an active layer, a source electrode, a drain electrode and a data line, forming a conductive channel between the source electrode and the drain electrode.

And the step S2 includes:

S21, depositing a passivation film;

S22, coating a layer of a photoresist on the passivation film, exposing and developing the photoresist using a monotone mask, forming an exposed region at a location where the transferring through hole is located without the photoresist, forming an unexposed region at other locations with remained photoresist;

S23, etching away the passivation film and the gate insulation layer in the fully exposed region by means of an etching process, forming the passivation layer in which a transferring through hole is formed, the transferring through hole simultaneously exposing a drain electrode and a pixel electrode.

The transferring through hole comprises a first through hole portion and a second through hole portion, the passivation layer in the first through hole portion is etched away to expose the drain electrode, the passivation layer and the gate insulation layer in the second through hole portion are etched away to expose the pixel electrode.

And the step S3 includes:

S31, depositing a second transparent conductive film;

S32, coating a layer of photoresist on the second transparent conductive film, exposing and developing the photoresist using a monotone mask, forming an unexposed region at locations where the common electrode and the connection electrode are located with remained photoresist, and forming an exposed region at other locations without the photoresist;

S33, etching away the second transparent conductive film in the fully exposed region by means of an etching process to form a common electrode and a connection electrode, the common electrode being a slit electrode and the connection electrode being connected with the pixel electrode and the drain electrode through the transferring through hole simultaneously.

In a plane parallel with the base, a shape of the connection electrode 60 may have a regular shape such as a rectangle, a circle, an ellipse or the like.

In one embodiment, the connection electrode is further disposed with a first compensation block that is used to improve the connection reliability of the connection electrode. The first compensation block is disposed on a side of the connection electrode adjacent to the gate line, an orthographic projection of the first compensation block on the base includes at least a portion of an orthographic projection of an edge of the drain electrode at a side adjacent to the gate line on the base, and in a direction parallel with the gate line, the orthographic projection of the first compensation block on the base covers an orthographic projection of a boundary of an overlapped region between the drain electrode and the pixel electrode at a side adjacent to the gate line on the base.

In another embodiment, the connection electrode is further disposed with a second compensation block, and the second compensation block is used to improve the connection reliability of the connection electrode. The second compensation block is disposed on a side of the connection electrode away from the gate line, and in a direction parallel with the data line, an orthographic projection of the second compensation block on the base includes at least a portion of an orthographic projection of an edge of the drain electrode at a side away from the gate line on the base, and in a direction parallel with the gate line, an orthographic projection of the second compensation block on the base covers an orthographic projection of a boundary of an overlapped region between the drain electrode and the pixel electrode at a side away from the gate line on the base.

In yet another embodiment, the connection electrode is also disposed with the first compensation block and the second compensation block simultaneously.

In a plane parallel with the base, shapes of the first compensation block and the second compensation block may be a rectangle, a trapezoid, a semicircle, a semi-ellipse, or the like.

The specific manufacturing process of the array substrate has been described in detail in the previous embodiments, which will not be repeated herein.

The embodiment provides a manufacturing method of an array substrate, and the connection between the drain electrode and the pixel electrode can be realized by means of one transferring through hole. Compared with the double-hole design of the existing structure, the embodiment effectively reduces the number of the through holes and increases the aperture ratio of the display panel. Simultaneously, the embodiment improves product quality and yield. Furthermore, the number of the patterning processes of the embodiment is the same with that of the patterning processes of the existing manufacturing, the process flow is the same as the existing manufacturing process flow, and therefore, the implementation of the embodiment does not need to change the existing process flow and the existing process apparatus, and has good compatibility, good practicability and good application prospects.

A Fifth Embodiment

An embodiment of the present disclosure also provides a display panel including the aforementioned array substrate. The display panel may be a mobile phone, tablet, TV, display, notebook, digital photo frame, navigator and any other product or component having a display function.

It should be noted that in the present disclosure, "the first through hole exposes the drain electrode, and the second through hole portion exposes the pixel electrode" and "the transferring through hole exposes the drain electrode and the pixel electrode" refers to the transferring through hole exposes the drain electrode and the pixel electrode before forming the connection electrode, to facilitate connection with the connection electrode, while in a final product, the transferring through hole is filled with other components, such as the connection electrode, and the drain electrode and the pixel electrode are not exposed in the final product.

In a plane parallel with the base, a shape of the transferring through hole may have a rectangle, a rectangle with a rounded edge, an ellipse, a circle, or the like, which is not limited to the embodiments of the present disclosure.

Embodiments of the present disclosure provide an array substrate, a manufacturing method thereof, and a display panel. The connection between the drain electrode and the pixel electrode is realized by means of one transferring through hole. Compared with the existing double-hole structure, the embodiments of the present disclosure effectively reduce the number of through holes and increase the aperture ratio of the display panel. Simultaneously, the single-hole structure of the embodiments of the present disclosure eliminates factors that cause display defects, improves product quality and yield. The embodiment of the present disclosure does not need to change the existing process flow and the existing process apparatus, and has good process compatibility, strong practicability, and good application prospects.

Indeed, it is not necessary that implementation of any one of products or methods of the present disclosure needs to achieve all the advantages described above simultaneously.

Other features and advantages of the present disclosure will be explained in the subsequent embodiments of the specification, and partly become obvious from the embodiments of the specification, or be understood by implementing the present disclosure. The objects and other advantages of the embodiments of the present disclosure can be realized and obtained by the structures particularly pointed out in the description, claims, and drawings.

In description of the embodiments of the present disclosure, it should be understood that the terms "middle", "upper", "lower", "front", "back", "vertical", "horizontal", "top", "bottom", "inner", "outer", etc. indicate the orientation or positional relation that is based on the orientation or positional relation shown in the drawings, only for facilitating the description of the present disclosure and simplify the description, rather than indicating or implying that the device or element in question must have a specific orientation, or is constructed and operated in the specific orientation, and therefore cannot be understood as a limitation of the present disclosure.

In description of the embodiments of the present disclosure, it should be noted that, unless otherwise clearly specified and defined, the terms "amount", "connected", and "connecting" should be understood in a general meaning. For example, it can be a fixed connection, a detachable connection, or an integral connection; it can be a mechanical connection or an electrical connection; it can be directly connected, or it can be indirectly connected through middleware, or it can be a connection inside two components. For those of ordinary skill in the art, the specific meaning of the above terms in the present disclosure can be understood in specific situations.

The following points need to be explained:

There are a few points to be noted:

(1) The accompanying drawings involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged, i.e., these drawings are not depicted at an actual scale. It will be understood that when an element such as a layer, film, region, or substrate is referred to as being "on" or "under" another element(s), it can be "directly on" or "directly under" the other element(s), or may present intermediate element(s).

(3) In case of no conflict, features in one embodiment or in different embodiments can be combined to obtain new embodiments.

The above embodiments are only specific implementations of the present disclosure, however, the protection scope of the present disclosure will not be limited thereto. Any of those skilled in the art can easily come up with change or replacement within the technical scope disclosed in the present disclosure, all of which shall be encompassed within the protection range of the present disclosure. Therefore, the protection scope of the present disclosure shall be subject to the protection scope of the claims.

This application claims the priority of Chinese patent application No. 201910030803.4 filed on Jan. 14, 2019, and the entire content of this Chinese patent application is incorporated herein by reference as part of this application.

What is claimed is:

1. An array substrate, comprising
a base;
a pixel electrode and a thin film transistor, disposed on the base;
a passivation layer, covering the thin film transistor and the pixel electrode, the passivation layer being provided with a transferring through hole exposing the pixel electrode and a drain electrode or a source electrode of the thin film transistor simultaneously;
a connection electrode, disposed on the passivation layer and at the transferring through hole,
wherein the connection electrode is connected with the pixel electrode, and the drain electrode or the source electrode through the transferring through hole,
wherein the array substrate further comprises a gate line and a data line, the thin film transistor comprises a gate electrode, an active layer, the source electrode and the drain electrode, the pixel electrode, the gate line and the gate electrode are disposed on the base, the pixel electrode, the gate line and the gate electrode are covered with a gate insulation layer, the active layer, the source electrode, the drain electrode and the data line are disposed on the gate insulation layer, and a conductive channel is formed between the source electrode and the drain electrode,
wherein a first compensation block is disposed at a side of the connection electrode close to the gate line, an orthographic projection of the first compensation block on the base includes at least a portion of an orthographic projection of an edge of the drain electrode or the source electrode at a side adjacent to the gate line on the base,
wherein the first compensation block extends from a mainbody of the connection electrode towards the gate line, and a size of the first compensation block is smaller than a size of the mainbody in a direction parallel to a direction of the gate line.

2. The array substrate according to claim 1, wherein an orthographic projection of the transferring through hole on the base overlaps with an orthographic projection of the pixel electrode on the base and an orthographic projection of the drain electrode or the source electrode on the base.

3. The array substrate according to claim 1, wherein an second compensation block is disposed at a side of the connection electrode away from the gate line, an orthographic projection of the second compensation block on the base includes at least a portion of an orthographic projection of an edge of the source electrode or the drain electrode at a side away from the gate line on the base.

4. The array substrate according to claim 3, wherein the second compensation block extends from the mainbody of the connection electrode to a direction away from the gate line, and a size of the second compensation block is smaller than a size of the mainbody in a direction parallel to a direction of the gate line.

5. The array substrate according to claim 4, wherein an orthographic projection of the connection electrode on the base covers an orthographic projection of an overlapped region between the drain electrode or the source electrode and the pixel electrode on the base.

6. The array substrate according to claim 1, wherein a shape of the first compensation block comprises a rectangle, a trapezoid, a semicircle or a semi-ellipse.

7. The array substrate according to claim 3, a shape of the second compensation block comprises a rectangle, a trapezoid, a semicircle or a semi-ellipse.

8. The array substrate according to claim 1, wherein the transferring through hole comprises a first through hole portion and a second through hole portion, the first through hole portion exposes the drain electrode, the second through hole portion exposes the pixel electrode.

9. A display panel comprising the array substrate according to claim 1.

10. A manufacturing method of an array substrate, comprising:
- forming a pixel electrode and a thin film transistor;
- forming a passivation layer covering the thin film transistor, the passivation layer being provided with a transferring through hole that exposes the pixel electrode and a drain electrode or a source electrode of the thin film transistor simultaneously;
- forming a connection electrode on the passivation layer and at the transferring through hole, wherein the connection electrode is simultaneously connected with the pixel electrode, and the drain electrode or the source electrode through the transferring through hole,
- wherein the forming a pixel electrode and a thin film transistor on the base comprises:
- forming the pixel electrode, a gate line and a gate electrode by means of one patterning process;
- forming a gate insulation layer, an active layer, a source electrode, a drain electrode and a data line by means of one patterning process, forming a conductive channel between the source electrode and the drain electrode,
- wherein a first compensation block is disposed at a side of the connection electrode close to the gate line, an orthographic projection of the first compensation block on the base includes at least a portion of an orthographic projection of an edge of the drain electrode or the source electrode at a side adjacent to the gate line on the base, the first compensation block extends from a mainbody of the connection electrode towards the gate line, and a size of the first compensation block is smaller than a size of the mainbody in a direction parallel to a direction of the gate line.

11. The manufacturing method according to claim 10, wherein a second compensation block is disposed at a side of the connection electrode away from the gate line, an orthographic projection of the second compensation block on the base includes at least a portion of an orthographic projection of an edge of the drain electrode or the source electrode at a side away from the gate line on the base.

12. The manufacturing method according to claim 11, wherein a size of the second compensation block is smaller than a size of the mainbody in a direction parallel to a direction of the gate line.

13. The manufacturing method according to claim 10, wherein the transferring through hole comprises a first through hole portion and a second through hole portion, the first through hole portion exposes the drain electrode, and the second through hole portion exposes the pixel electrode.

14. The manufacturing method according to claim 10, wherein the forming a pixel electrode, a gate line and a gate electrode by means of one patterning process comprises:
- depositing a first transparent conductive film and a first metal film on the base sequentially;
- coating a layer of photoresist on the first metal film, gradient exposing and developing the photoresist using a halftone mask or a gray tone mask, forming an unexposed region at a location where the gate line and the gate electrode to be formed are located, the unexposed region being with a photoresist having a first thickness, forming a partially exposed region at a location where the pixel electrode to be formed is located, the partially exposed region being with a photoresist having a second thickness, forming a fully exposed region at other locations without a photoresist, and the first thickness is greater than the second thickness;
- etching away the first metal film and the first transparent conductive film in the fully exposed region by means of a first etching process;
- removing the photoresist in the partially exposed region by means of an ashing process, exposing the first metal film; and
- etching away the first metal film in the partially exposed region by means of a second etching process, removing a remaining portion of the photoresist and forming the pixel electrode, the gate line and the gate electrode on the base.

15. The manufacturing method according to claim 10, wherein the forming a gate insulation layer, an active layer, a source electrode, a drain electrode and a data line, forming a conductive channel between the source electrode and the drain electrode by means of one patterning process comprises:
- depositing a gate insulation film, a semiconductor film and a second metal film on the base on which the pixel electrode, the gate line and the gate electrode are formed;
- coating a layer of photoresist on the second metal film, gradient exposing and developing the photoresist using a halftone mask or a gray tone mask, forming an unexposed region at a location where the source electrode, the drain electrode and the data line to be formed are located, the unexposed region being with a photoresist having a first thickness, forming a partially exposed region at a location where the conductive channel to be formed is located, the partially exposed region being with a photoresist having a second thickness, forming a fully exposed region at other locations without a photoresist, and the first thickness is greater than the second thickness;
- etching away the second metal film and the semiconductor film in the fully exposed region by means of a first etching process;
- removing the photoresist in the partially exposed region by means of an ashing process, exposing the second metal film;
- etching away the second metal film in the partially exposed region by means of a second etching process, removing a remaining portion of the photoresist, forming the gate insulation layer, the active layer, the source electrode, the drain electrode and the data line, forming a conductive channel between the source electrode and the drain electrode.

16. The manufacturing method according to claim 10, wherein the forming the passivation layer covering the thin film transistor, and the passivation layer being provided with a transferring through hole that exposes the pixel electrode and a drain electrode or a source electrode of the thin film transistor simultaneously comprises:
- depositing a passivation film on a base on which the thin film transistor and the pixel electrode are formed;
- coating a layer of photoresist on the passivation film, exposing and developing the photoresist using a monotone mask, forming an exposed region at a location of the transferring through hole without the photoresist, forming an unexposed region at other locations in which the photoresist is remained;
- etching away the passivation film and the gate insulation layer in the fully exposed region by means of an etching process, forming the passivation layer in which the transferring through hole is formed and the transferring through hole exposing a drain electrode and a pixel electrode simultaneously,
wherein the transferring through hole comprises a first through hole portion and a second through hole portion, the passivation film in the first through hole portion is etched away and the drain electrode is exposed, and the passivation film and the gate insulation layer in the second through hole portion are etched away and the pixel electrode is exposed.

* * * * *